US008775977B2

(12) United States Patent
Hsu et al.

(10) Patent No.: US 8,775,977 B2
(45) Date of Patent: Jul. 8, 2014

(54) DECOMPOSITION AND MARKING OF SEMICONDUCTOR DEVICE DESIGN LAYOUT IN DOUBLE PATTERNING LITHOGRAPHY

(75) Inventors: Chin-Chang Hsu, Banqiao (TW); Wen-Ju Yang, Hsinchu (TW); Hsiao-Shu Chao, Baoshan (TW); Yi-Kan Cheng, Taipei (TW); Lee-Chung Lu, Taipei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 70 days.

(21) Appl. No.: 13/027,520

(22) Filed: Feb. 15, 2011

(65) Prior Publication Data
US 2012/0210279 A1    Aug. 16, 2012

(51) Int. Cl.
*G06F 17/50* (2006.01)
(52) U.S. Cl.
USPC .............. 716/50; 716/51; 716/52; 716/54; 716/55; 716/56
(58) Field of Classification Search
CPC . G06F 17/50; G06F 17/5072; G06F 17/5009; G06F 17/5081; G06F 2217/12; G06F 2217/78; G06F 17/5077; G06F 2217/10; G06F 11/00; H01L 22/20
USPC ............................ 716/51, 52, 53, 54, 55, 56
See application file for complete search history.

(56) References Cited

U.S. PATENT DOCUMENTS

| | | | |
|---|---|---|---|
| 6,030,752 A | 2/2000 | Fulford, Jr. et al. | |
| 7,571,419 B2 | 8/2009 | O'Brien | |
| 7,698,665 B2 | 4/2010 | Abrams et al. | |
| 7,934,177 B2 | 4/2011 | Shin et al. | |
| 8,368,182 B2 | 2/2013 | Lee et al. | |

(Continued)

FOREIGN PATENT DOCUMENTS

| | | |
|---|---|---|
| CN | 101241517 A | 8/2008 |
| CN | 101764130 A | 6/2010 |
| CN | 101770529 A | 7/2010 |

OTHER PUBLICATIONS

Official Action issued Mar. 22, 2013, in counterpart Chinese Patent Application No. 201110242092.0.

*Primary Examiner* — Thuan Do
*Assistant Examiner* — Brian Ngo
(74) *Attorney, Agent, or Firm* — Duane Morris LLP

(57) ABSTRACT

Provided is a system and method for assessing a design layout for a semiconductor device level and for determining and designating different features of the design layout to be formed by different photomasks by decomposing the design layout. The features are designated by markings that associate the various device features with the multiple photomasks upon which they will be formed and then produced on a semiconductor device level using double patterning lithography, DPL, techniques. The markings are done at the device level and are included on the electronic file provided by the design house to the photomask foundry. In addition to overlay and critical dimension considerations for the design layout being decomposed, various other device criteria, design criteria processing criteria and their interrelation are taken into account, as well as device environment and the other device layers, when determining and marking the various device features.

17 Claims, 5 Drawing Sheets

(56) References Cited

U.S. PATENT DOCUMENTS

| | | |
|---|---|---|
| 2002/0091986 A1 | 7/2002 | Ferguson et al. |
| 2008/0189672 A1* | 8/2008 | Shin et al. .................. 716/19 |
| 2008/0195994 A1* | 8/2008 | O'Brien ........................ 716/19 |
| 2010/0169852 A1 | 7/2010 | Yu |
| 2011/0004858 A1* | 1/2011 | Chang et al. .................. 716/122 |
| 2011/0111330 A1* | 5/2011 | Schultz et al. .................... 430/5 |
| 2011/0197168 A1* | 8/2011 | Chen et al. ....................... 716/50 |
| 2012/0131528 A1* | 5/2012 | Chen et al. .................... 716/112 |

\* cited by examiner

DECOMPOSITION AND MARKING OF SEMICONDUCTOR DEVICE DESIGN LAYOUT IN DOUBLE PATTERNING LITHOGRAPHY

TECHNICAL FIELD

The present disclosure relates, most generally to photomasks used in the manufacture of semiconductor devices, and the production of such photomasks. More particularly, the present disclosure relates to double patterning lithography (DPL) device layout decomposition for photomasks.

BACKGROUND

In today's semiconductor manufacturing industry, large-scale integrated circuit (LSI) devices continue to be developed at increased levels of integration and complexity. These increased levels of integration require minute and highly accurate LSI patterns to be developed and produced. These patterns require highly accurate pattern formation technologies for forming the minute pattern features. According to conventional technologies, semiconductor devices such as integrated circuits, are fabricated on a semiconductor substrate using a photomask set, each photomask used to form a complete exposure pattern at a particular device level. The exposure pattern is transferred onto the device using photolithography and other operations and may also be referred to as a device pattern. When the exposure pattern is formed in a masking layer such as photoresist, it is used as a mask for implantation, etching or any of various other processing operations that are carried out upon the semiconductor substrate to produce the device pattern. As device features continue to become more miniaturized and formed in closer proximity, and as the dimensions of the device features approach or become smaller than the wavelengths of the light used to expose the particular features, one approach has been to use DPL, double patterning lithography, to form the device pattern on the semiconductor substrate.

According to conventional methods, a design house provides a design layout of the exposure pattern typically in an electronic file, such as a file stored on a computer readable storage medium. The design layout may be generated using CAD, computer-aided design, techniques and the exposure pattern is provided to a mask foundry which manufactures photomasks according to the design layout. According to DPL techniques, the design layout is decomposed into two separate portions, each formed onto a separate photomask. The decomposition results in two photomasks and a pattern is formed in a layer of the semiconductor device by first performing a lithography operation using one photomask, then performing an etching or implantation or other operation upon the layer, then performing a second lithography operation using the other photomask and performing a separate etching or implantation or other operation upon the layer.

The design layout of the exposure pattern is conventionally provided by the design house to the mask foundry. The decomposition of the design layout is conventionally done by the foundry which decomposes the design layout into two design layouts based essentially only on minimum spacing design rules for the design layout at hand, and then produces the two masks from the two decomposed design layout patterns. A shortcoming of present DPL techniques is that the mask foundry does not take other factors into account when decomposing the masks. According to conventional techniques, when a particular design layout is used in conjunction with different devices or different processing technologies, or used in different device environments, these differences are not considered by the mask foundry when decomposing the design layout.

Present DPL techniques are therefore beset with various shortcomings and limitations.

BRIEF DESCRIPTION OF THE DRAWING

The embodiments of the disclosure are best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
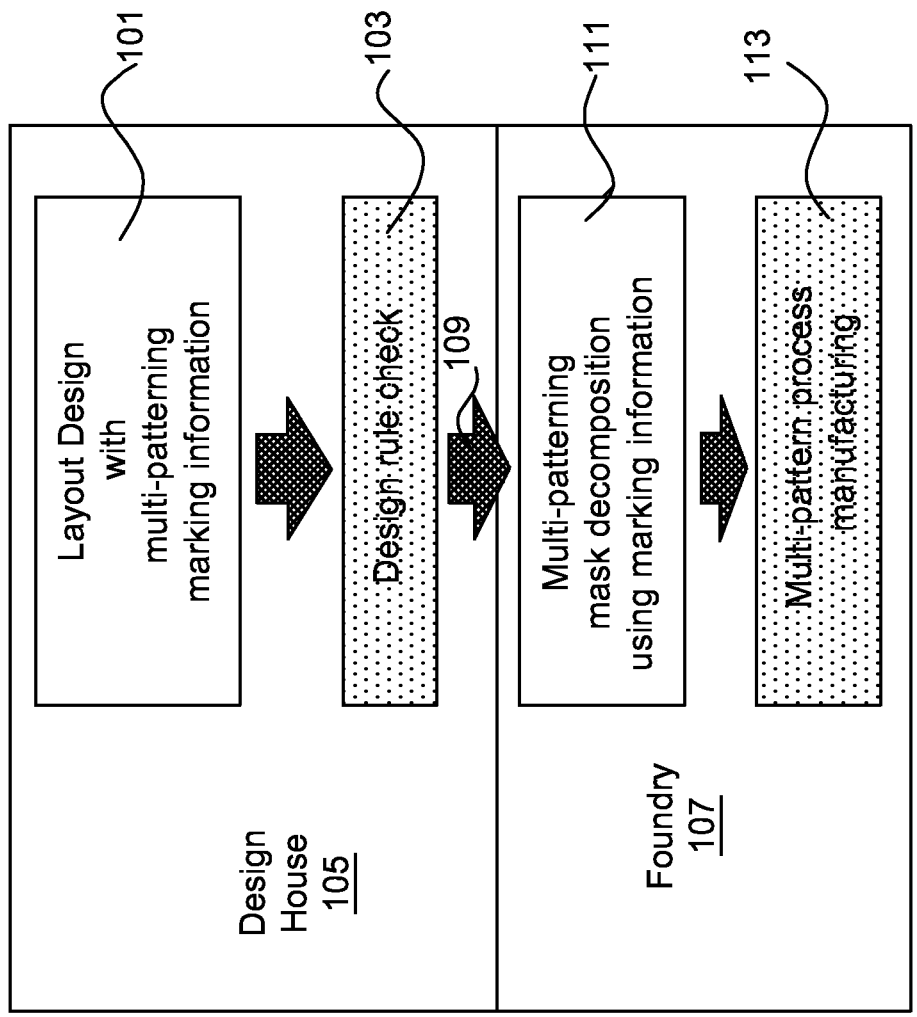
FIG. 1 is a flowchart illustrating an exemplary method of the disclosure.

A design layout is representative of an exposure pattern to be formed on a semiconductor device. The design layout may be stored and provided to a mask foundry on a computer readable electronic storage medium or other electronic file or other suitable means. The device features of the design layout are decomposed into two separate photomasks used to form the particular exposure pattern. The device features to be decomposed onto a first mask are so designated and the device features to be decomposed onto a second mask are so designated at the design level, i.e. on the design layout provided to the mask foundry. Stitching locations are also designated at the design level, i.e. on the design layout provided to the mask foundry. The stitching locations are locations at which features from two different decomposed masks are stitched together to form a continuous feature. The design layout provided to the mask foundry includes markings associating features with the first or second photomasks and also stitching locations and may also include additional markings to block portions of the design layout from being subject to decomposition. When a feature is associated with a particular photomask by marking, e.g. associated with a first photomask, the feature will thus appear on the first photomask and will be produced on a semiconductor device using the first photomask and at least a photolithography operation.

According to one aspect, a method is provided for marking the design layout at the design level and prior to decomposition at the mask foundry. The marking takes into account design rules, design criteria, device considerations and special processing constraints and is included on the original electronic file or other design layout provided to the mask foundry. The variation between processes and their impact upon factors such as CD, critical dimension, and OVL, overlay, affect device performance and yield and are taken into account in determining how to separate the device features and marking them accordingly. The overall symmetry of the device level may be taken into account when marking the device features for decomposition. The features in a design layout at a particular device level that directly affect the device speed or another electrical parameter, may be marked so that they are each formed on and by the same photomask in one embodiment. The features of the same process group may be marked to be formed on the same photomask. The environment of the device features or of a particular cell containing the device features, previous processing operations and the underlying substructure may be taken into account in associating the device features with a particular photomask and marking them accordingly. In other words, criteria other than critical dimensions are taken into account in associating the device features with a particular photomask and marking them accordingly. Embodiments of the disclosure provide for identifying certain regions as favorable stitching locations and identifying other regions where the design layout should not be decomposed. The stitching location of a particular device level may be done taking into account the underlying geometry, such consideration not typically considered according to conventional technology. A particular layout, i.e. a particular cell within a design layout, may appear multiple times and perform differently in different locations and have different processing considerations depending on its environment and such issues are taken into account when marking the layout for decomposition.

Since the designating and marking of features take place at the design level, the design layout can be made without having to design around various design rules since the design can simply designate features that may create design challenges, to be produced on separate photomasks when the design layout is decomposed. Additional, peripheral concerns associated with features that are too closely spaced, for example, need not be addressed since such features may be associated and marked to be formed on and using different photomasks.

According to another aspect of the disclosure, a computer readable storage medium or other electronic file is provided. The computer readable storage medium is encoded with computer program code, such that when the computer program code is executed by a processor, the processor performs a method for producing multiple photomasks from a design layout, such as by first decomposing according to the method described herein. A CAD tool may generate an electronic file stored on the computer readable storage medium. The computer readable storage medium may be a tape out being a final approved electronic CAD file from which one or more photomasks are formed. The tape out is the final result of the design cycle produced by the design house for the semiconductor integrated circuit or other device and is the electronic file sent to the mask foundry and is used in the manufacture of the photomasks. The electronic file includes a design layout already marked such that two or more photomasks will be formed from the single device layout.

In one aspect, a method is provided for decomposing a design layout into a plurality of photomasks that may be combined to form an exposure pattern for a semiconductor device using DPL, double pattern lithography, techniques. The method includes identifying an exposure pattern to be transferred onto a semiconductor substrate to produce an integrated circuit device, the exposure pattern in the form of a design layout. The method also comprises providing instructions to a mask foundry for decomposing the exposure pattern to produce a plurality of photomasks to be used in combination to form the exposure pattern on the semiconductor substrate using DPL technology, by marking features of the design layout based upon at least one of device criteria and processing criteria, prior to the mask foundry carrying out the decomposing. The marking comprises marking first features with a first marking that designates the first features to be included on a first photomask, marking second features with a second marking that designates the second features to be included on a second photomask, marking stitching locations with stitching markings and blocking portions on the exposure pattern from being decomposed.

In another aspect, a method is provided for decomposing a design layout into a plurality of photomasks that may be combined to form an exposure pattern using DPL techniques, the method comprising identifying a design layout of an exposure pattern for an integrated circuit device, to be decomposed. The method also comprises providing an electronic file of the design layout to a mask foundry, the design layout including first features with a first marking designating the first features to be formed on a first photomask, second features with a second marking designating the second features to be formed on a second photomask, and stitching locations marked with stitching markings. The method further comprises the mask foundry decomposing the design layout based on the electronic file, into a plurality of layouts and forming a photomask from each layout.

A design layout for a device pattern of the semiconductor device is also provided. The layout comprises an electronic file of an exposure pattern for a semiconductor device level. The electronic file comprises a computer readable electronic storage medium and the exposure pattern comprises a design layout. The design layout comprises a plurality of features that combine to form the exposure pattern and markings designating features of the plurality of features to be formed on a particular one of a plurality of photomasks that combine to form the exposure pattern.

FIG. 1 is a schematic illustrating an exemplary method. Step 101 may be carried out in conjunction with step 103 within design house 105. At step 101, a design layout, referred to hereinafter as "design layout", is provided with multi-patterning marking information, i.e. the design layout includes markings. The marking information designates certain features of the design layout to be formed on a first photomask and other features of the design layout to be formed on a second photomask. This marking information guides foundry 107 as it performs the mask decomposition procedure and produces multiple photomasks from the design layout which may be in the form of a tapeout. The design layout with marking information is provided at 109 to foundry 107 which carries out multi-patterning mask decomposition using the marking information, at step 111. At step 113, foundry 107 manufactures multiple photomasks from the marked design layout.

The marking is done at the design level with a designer's point-of-view in mind. Various design rules, design criteria, device considerations and processing constraints, discussed supra and infra, are used to dictate how the design layout is marked for decomposition into two or more photomasks that combine to form the exposure pattern associated with the design layout. For example, design rules concerning CD's, critical dimensions, minimum spacing rules and overlay, OVL, concerns are used to determine which features are to be formed using different photomasks. Typically, when the design layout is decomposed into two photomasks that combine to form the exposure pattern, different exposure settings will be used for the different photomasks. In one embodiment, a first pattern formed by a first photomask is formed on the semiconductor substrate using photolithography and an etching procedure is carried out to translate that first pattern into a device layer, then the second photomask is used to form a second pattern on the device layer using photolithography and this is followed by a subsequent, second etching operation that also etches the device layer. After the first photolithography, first etching, second photolithography, and second etching procedures have been carried out, a pattern is formed in the device layer. The etching operation is intended to be exemplary only and according to other exemplary embodiments, other processing operations may be carried out according to the sequence of: photolithography I, processing operation I, photolithography II, and processing operation II. In one embodiment, the processing operation may be an implantation or other operation used in conjunction with a mask provided by a photolithography process, to form a semiconductor device. According to yet another exemplary embodiment, a first photolithography pattern may be formed in a photoresist layer by a first photomask on the semiconductor substrate and a second photolithography pattern may be formed in the same or a different photoresist layer by a second photomask and then, after both photolithography patterns have been formed, an etching, implantation or other processing operation may be carried out upon the device level to produce the device pattern.

Aspects of the invention provide for considering design, device and processing criteria to 1) determine which features should be associated with which of multiple photomasks and also to determine stitching locations and blocking locations, and 2) marking the features appropriately by using letters or other text, symbols, blocks, numbering, colorizing, or any suitable marking means. The marking takes place at the design level, i.e. in design house 105 and the electronic file or other representation of the design layout may be appropriately marked. As such, the marking information is stored in the design layout provided to foundry 107.

The foundry decomposes the design layout and manufactures the photomasks in accordance with the design layout and marking information. The design layout is split into two or more layouts according to the marking information and a photomask is formed from each of the layouts. The photomasks are used to combine to form a pattern in the semiconductor device. This determining and marking procedure may take place at multiple device levels in the manufacture of a semiconductor integrated circuit or other device.

Some of the design, device and processing criteria that are used to determine which features are to be marked for being formed on a first photomask and which features are to be marked for being formed on a second photomask include but are not limited to, the following. Regardless of the particular device level being decomposed, factors related to the other levels, i.e. underlying and subsequent, of the semiconductor device are taken into account during the determination and marking of features at the particular device level. In one embodiment, all features having a substantially similar size or critical dimension, may be identified and marked to be formed on the same photomask. According to another exemplary embodiment, all features that include substantially the same or similar shapes may be marked to be formed on the same one of the multiple photomasks formed through decomposition of the design layout. Features that will be subjected to the same processing conditions, e.g. nested features as opposed to isolated features, may be similarly marked. Features in too close proximity will be decomposed to be produced by separate photomasks. Overall device symmetry may be taken into account when marking the features for decomposition, i.e. the marking may be used to prevent the predomination of features on one side or in one section of any of the photomasks formed by decomposition. Pattern density equality among the multiple photomasks formed through decomposition of the design layout, may be achieved in one exemplary embodiment. According to another exemplary embodiment, all features that are critical or determinative of device speed, or another device parameter or characteristic, may be so marked to be formed on the same photomask.

According to another exemplary embodiment, all features of the same process group may be so marked to be formed on the same photomask. Optical proximity correction concerns may be taken into account when associating and marking device features for a particular photomask. Process deviation may also be taken into account. For example, if a particular exposure pattern for a particular device level is to be used in conjunction with different devices, i.e. devices that include different underlying substructures, and which may have substructures formed by different processing techniques, the different substructures and/or different proceeding processes are taken into account when designating and marking features to be decomposed into different masks. The impact of different processes or of process variation upon CD's and overlay, is determined and taken into account in designating and marking the device features for inclusion on the appropriate associated photomask. According to another exemplary embodiment, surrounding or other proximate structures or other aspects of the environment within which the exposure pattern will be utilized, are taken into account. The overall design layout may be apportioned into different cells, some of which may be repeating cells, and similar cells may be decomposed differently depending on the environment of the cells, i.e. the region that abuts or surrounds the different cells. The device features are decomposed to produce two layouts that, when produced on two photomasks, produce the most precise, accurate, and efficient pattern with a robust process margin.

Various factors may be taken into account to determine the stitching locations. Stitching locations represent the locations where a continuous feature in a design layout is separated into two features that will appear on, and be produced by, different masks that combine to produce the exposure pattern in which the feature is continuous on the device produced. Stitching locations may advantageously be determined and marked at locations spaced far from critical circuit features. Stitching locations may also be determined taking into account previous processing layers. For example, the stitching location of an exposure pattern used to form a polysilicon pattern, will advantageously be at a location other than a transistor gate location.

At the design level, the functional representation of the design layout of the exposure pattern may be in hierarchical polygon representation. The design layout of a semiconductor device is governed by a large number of geometric rules and contains geometric features such as polygons to indicate proper size, shape, location and separation of device features. The aforementioned device, design, and processing criteria and their interrelation may be applied to the polygon representation at the design level to designate the design layout decomposition into two photomasks. Particular polygons of the design layout may be pre-assigned for decomposition at the design level to avoid process variation between polygons representing different device features. According to the hierarchical polygon representation, high priority polygons, low priority polygons, minor polygons and so forth may be established at the design level and used in designating and marking how the features should be decomposed. For example, foundry can decompose high priority polygons first, then low priority polygons. This approach forces the stitching on low priority polygons if stitching is unavoidable.

Figure 2:
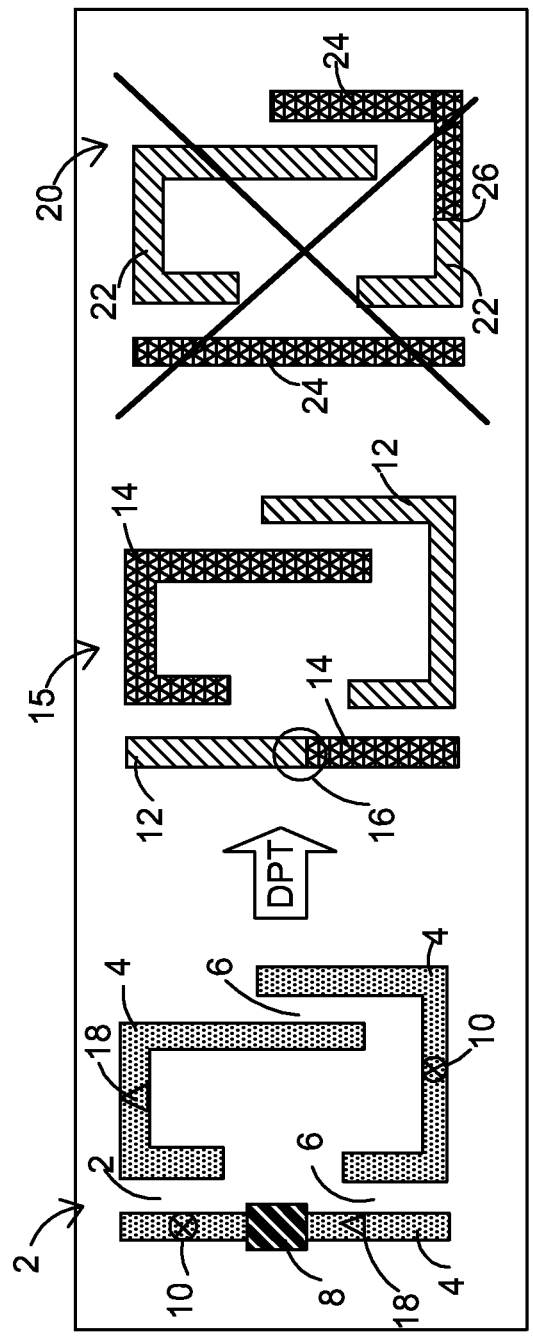
FIG. 2 shows an exemplary design layout representing an exposure pattern, decomposed and marked according to an exemplary embodiment of the disclosure.

FIG. 2 illustrates pattern 2 on the left hand side of the DPT arrows. Pattern 2 represents a portion of a design layout that represents an exposure pattern to be transferred onto a semiconductor device using photolithographic techniques. Patterns 15 and 20 on the right hand side of the DPT arrow represent two possible composite patterns formed by the superimposition of first and second features formed by different photomasks, each of the first and second features representing a decomposed portion of pattern 2.

Features 4 make up pattern 2 and locations 6 are indicative of spacing violations, i.e. locations where features 4 are spaced too closely together and in violation of design rules regarding minimum spacings between features for one photomask. According to various embodiments, when pattern 2 is decomposed, it may be decomposed differently, i.e. it may be decomposed into pattern 15 or into pattern 20.

In each of patterns 15 and 20, first features 12, 22 may represent features on a first photomask and second features 14, 24 features on a second photomask. Alternatively, first features 12, 22 and second features 14, 24 may be considered to represent features formed in a semiconductor device using first and second photomasks, respectively, and which combine to form a device pattern in the semiconductor device.

Pattern 15 shows first features 12, second features 14, and stitching location 16. In contrast, pattern 20 shows pattern 2 decomposed resulting in first features 22, second features 24, and stitching location 26. An examination of patterns 15 and 20 in FIG. 2 reveals that first features 12 of pattern 15 are different than first features 22 of pattern 20, second features 14 of pattern 15 are different than second features 24 of pattern 20. Respective stitching locations 16 and 26 are also different. Either pattern 15 or 20 may be produced when decomposition is carried out by the foundry without regard to the design, device and processing criteria of the disclosure, i.e. and without the features having been identified and marked at the design level.

According to the device feature designating and marking aspects of the disclosure, pattern 2 may be decomposed such that no photomask includes two features in close proximity that would violate a design rule on that particular device level, i.e. the features on either side of space violation 6 will be formed by different photomasks. According to one embodiment, the aforementioned device, design and processing criteria and their interrelationship may render pattern 20 less desirable than pattern 15, as suggested by the "X" that appears over pattern 20. Pattern 20 may be less desirable than pattern 15 for various reasons that render pattern 20 more difficult to produce and/or less compatible with underlying or subsequent device layers.

Features 4 of pattern 2 include first markings 10 and second markings 18. The symbols used are exemplary only and are used to produce desirable pattern 15. First markings 10 identify features that will be produced by a first photomask and second markings 18 identify features that will be formed on a second photomask when pattern 2 is decomposed. Stitching marking 8 identifies a desired stitching location. With the features so marked, decomposed pattern 15 is produced as a result of the decomposition process carried out by the foundry based on markings 8, 10 and 18 that appear on the design layout provided to the foundry. Because the features are marked, less desirable pattern 20 is not formed. Stitching location 16 of pattern 15 is identified to be at a less critical location in the design than is stitching location 26 of pattern 20. First features 12 are marked to be formed on a different photomask than second features 14 due to at least one of the aforementioned design, device and processing criteria, and their interrelation. The physical pattern actually formed on a semiconductor device and as shown in patterns 15 and 20, is formed using two different photomasks, one including only first features 12 and the other including only second features 14.

Figure 3A:
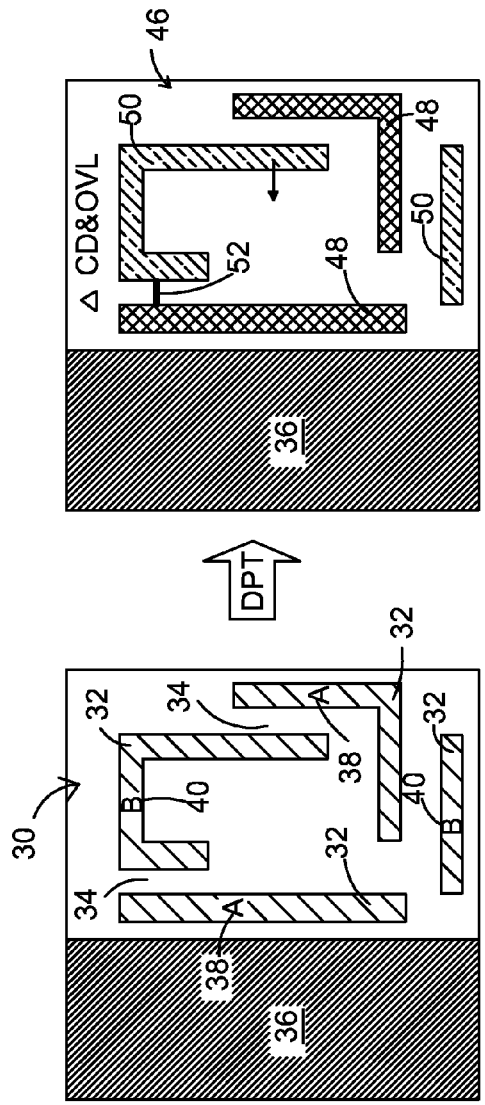
FIGS. 3A and 3B show an exemplary design layout representing an exposure pattern, decomposed and marked according to an exemplary embodiment of the disclosure.
Figure 3B:
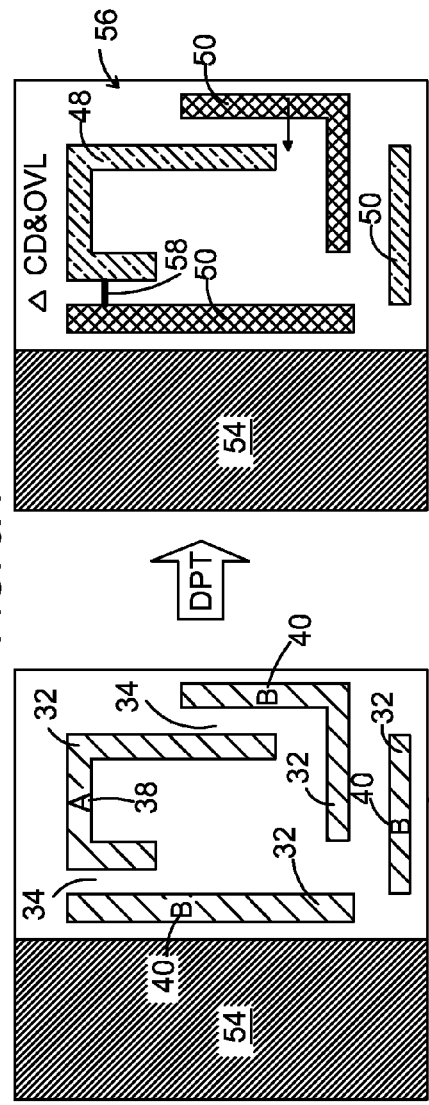

FIGS. 3A and 3B are presented adjacent one another on the same drawing sheet to illustrate another aspect of the disclosure, namely, how one pattern 30 may be decomposed differently depending on device environment and/or the impact of process variation on CD and overlay. In each of FIGS. 3A and 3B, pattern 30 includes features 32. Locations 34 represent design violations, particularly where minimum spacing requirements are not complied with in the exemplary illustration. In other words, features 32 are spaced too closely together at locations 34 to be reliably produced by the same photomask. In each of FIGS. 3A and 3B, markings 38 identify features that will be formed on a semiconductor device using a first photomask and markings 40 identify features that will be formed on the semiconductor device by a second photomask.

In FIG. 3A, the cell that includes pattern 30 is adjacent section 36 and in FIG. 3B the cell that includes pattern 30 is adjacent section 54, sections 36 and 54 being different and representing different environments for the cell that includes pattern 30. Different sections 36 and 54 may differ by pattern density or exposed materials present according to various exemplary embodiments. Pattern 30 may represent a cell or a portion of a cell that appears multiple times in one device layout associated with a particular device level. According to the embodiment shown in FIG. 3A in which the cell is adjacent section 36, the features are marked to produce decomposed pattern 46 including first features 48 to be included on a first photomask and second features 50 to be included on a second photomask. In comparison, in FIG. 3B in which the cell is adjacent section 54, pattern 56 also includes first features 48 to be included on a first photomask and second features 50 to be included on a second photomask. Patterns 46 and 56 may also be understood to represent a pattern formed in a semiconductor device in which first features 48 were formed using a first photomask and second features 50 were formed using a second photomask. First features 48 and second features 50 of pattern 46 are different than first features 48 and second features 50 of pattern 56. Additionally, spacing 52 of pattern 46 is different than spacing 58 of pattern 56, as the decomposition may be further custom tailored in view of other processing concerns and device and design issues. In one exemplary embodiment, different processes may be used to form the semiconductor devices from the photomasks produced via decomposition, in FIGS. 3A and 3B. The impact of the process variation may be relied upon when associating and marking features 32 as first features 48 and second features 50.

Figure 4:
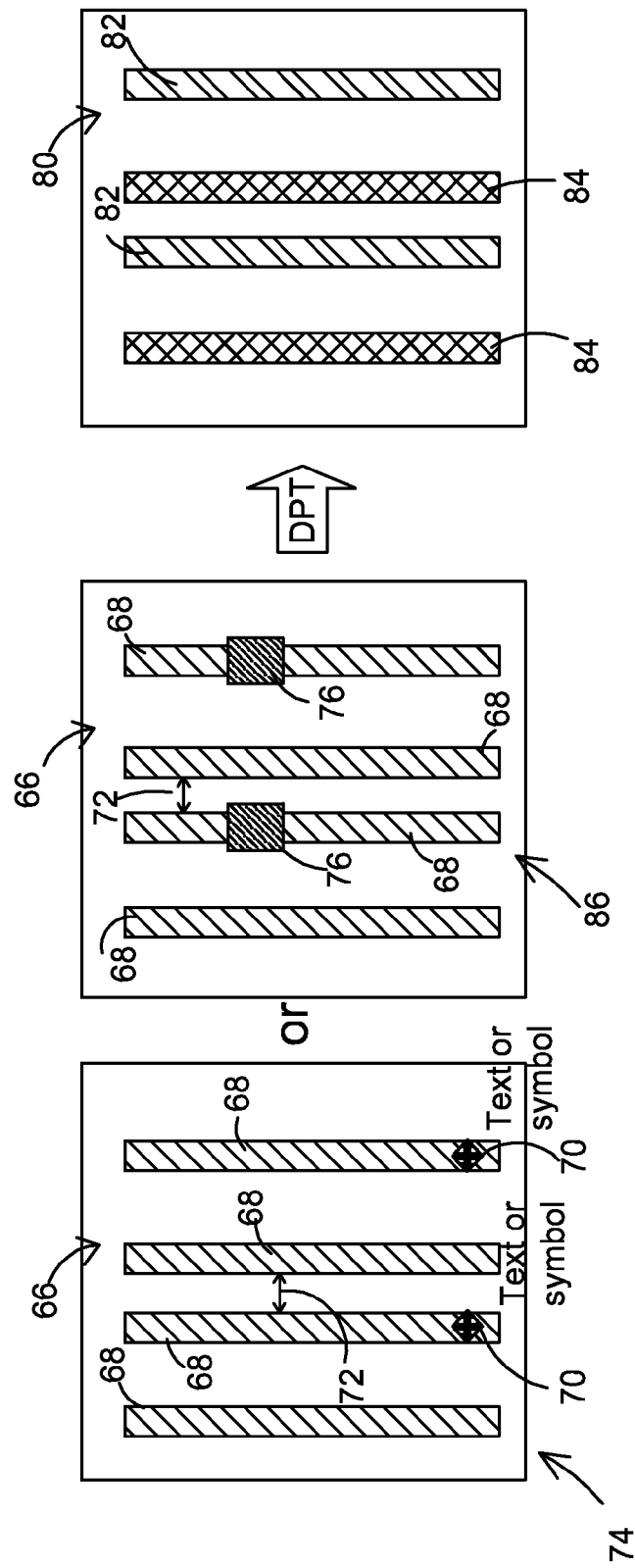
FIG. 4 shows an exemplary design layout marked with exemplary markings and decomposed accordingly.

FIG. 4 illustrates exemplary symbols used as markings to decompose a pattern. Pattern 66 includes features 68 and spacing 72 represents a design rule violation or other reason for associating adjacent features with different photomasks. First marked pattern 74 differs from second marked pattern 86 because of the different markings used. First marked pattern 74 includes text or symbol 70 identifying which of features 68 are to be formed on a first photomask and in marked pattern 86, rectangles 76 are used to mark these features. In other exemplary embodiments, different marks can be used. According to one exemplary embodiment, the different features marked to be produced on different photomasks, may appear as features having different colors when the design layout is displayed on hard copy or as a graphical representation of the design layout stored on an electronic file. According to either of first marked pattern 74 or second marked pattern 86, pattern 80 is formed and includes first features 82 and second features 84 which will be formed by different masks.

Figure 5:
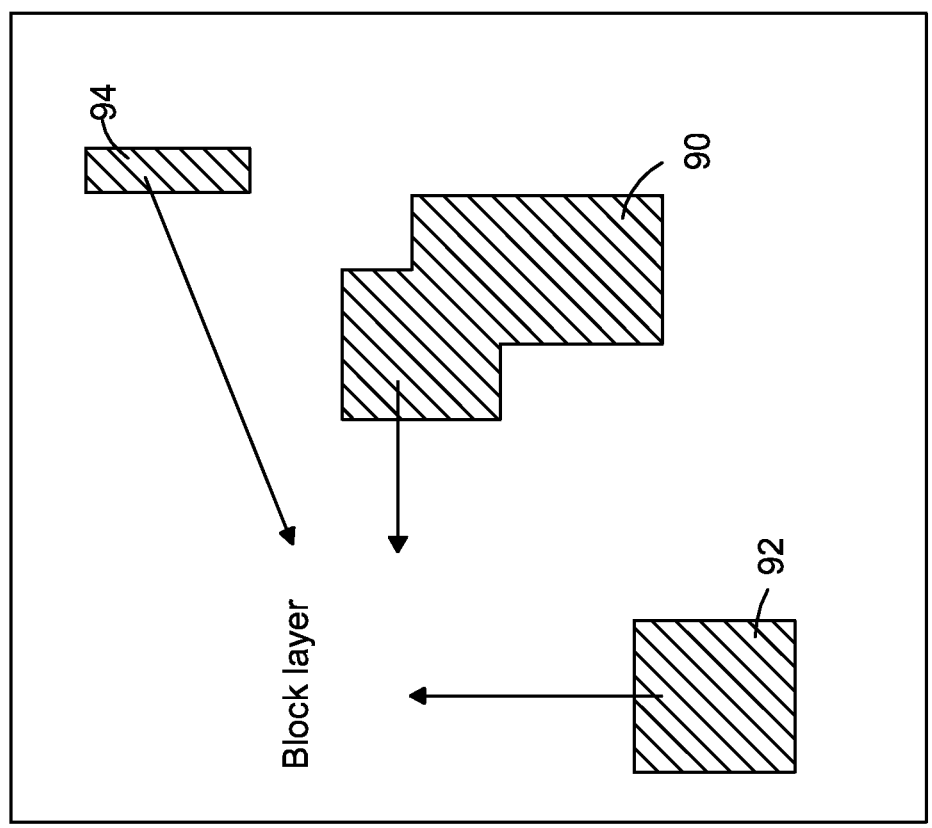
FIG. 5 shows exemplary markings to block portions of the design layout from being decomposed.

FIG. 5 illustrates variously shaped blocks 90, 92 and 94 which may be used to mark portions of the design layout that should not be subject to decomposition. These areas which will be formed by the same photomask will be determined by any or all of the various device, design and processing criteria discussed supra. According to one exemplary embodiment, block 90, 92 or 94 may be applied to a portion of a design layout in which the dimensions and the geometries of the circuit features are not critical. For example, the device features in this portion of the layout may not include minimum spacings. At the same time, these features may be critical in the electronics or other functionality of the device and should advantageously be blocked so as to be formed on the same photomask and thus not decomposed. In the prior art, in comparison, no such restriction upon decomposition is provided to the foundry.

The preceding merely illustrates the principles of the embodiments. It will thus be appreciated that those skilled in the art will be able to devise various arrangements which, although not explicitly described or shown herein, embody the principles of the embodiments and are included within their spirit and scope. Furthermore, all examples and conditional language recited herein are principally intended expressly to be only for pedagogical purposes and to aid the reader in understanding the principles of the embodiments and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus, e.g. photomask or semiconductor device, be constructed or operated in a particular orientation.

Although the embodiments have been described in terms of exemplary embodiments, it is not limited thereto. Rather, the appended claims should be construed broadly, to include other variants and embodiments, which may be made by those skilled in the art without departing from the scope and range of equivalents

What is claimed is:

1. A method for decomposing a design layout for a semiconductor device into a plurality of photomasks that may be combined to form an exposure pattern using DPL (double pattern lithography) techniques, said method comprising:
    identifying a design layout of an exposure pattern for a semiconductor device, to be decomposed;
    generating an electronic file of said design layout on a non-transitory computer readable electronic storage medium using a computer at a design level, said electronic file of said design layout including first features each having a first marking designating said first features to be formed on a first photomask, second features each having a second marking designating said second features to be formed on a second photomask, and stitching locations each having a stitching marking designating each said stitching location as a location at which said first and second features meet to form a continuous device feature of said design layout wherein;
    said semiconductor device comprises an integrated circuit device and said providing said electronic file of said design layout includes marking said design layout according to criteria other than critical dimension, including:
    marking similarly sized features with the same marking;
    marking features that substantially determine device speed, with the same marking;
    providing said non-transitory computer readable electronic storage medium to a mask foundry; and
    said mask foundry decomposing said design layout based on said electronic file, into a plurality of layouts, and forming a photomask from each said layout.

2. The method as in claim 1, wherein said first marking, said second markings and said stitching markings comprise one of text features, symbols, colors and blocks.

3. The method as in claim 1, wherein said semiconductor device comprises an integrated circuit device and said providing said electronic file of said design layout includes marking said design layout according to criteria other than critical dimension, including at least one of:
    marking similarly shaped features with the same marking;
    marking features that will be subjected to the same processing conditions, with the same marking;
    marking similarly sized features with the same marking;
    marking features that substantially determine device speed, with the same marking;
    marking features based on further device features on underlying device levels; and
    marking features according to effects of process operations that take place upon said integrated circuit device prior to forming said exposure pattern on said integrated circuit device.

4. The method as in claim 1, wherein said providing includes said first features, said second features and said stitching locations of said design layout marked according to criteria other than critical dimensions.

5. A method for decomposing a design layout into a plurality of photomasks that may be combined to form an exposure pattern for a semiconductor device using DPL (double pattern lithography) techniques, said method comprising:
    identifying an exposure pattern to be transferred onto a semiconductor substrate to produce an integrated circuit device, said exposure pattern comprising a design layout;
    using a computer for providing instructions to a mask foundry for decomposing said exposure pattern to produce a plurality of photomasks to be used in combination to form said exposure pattern on said semiconductor substrate using DPL technology, by marking features of said design layout based upon design criteria and providing a non-transitory computer readable electronic storage medium including said design layout with marked features at a design level and prior to said mask foundry carrying out said decomposing, said marked features comprising:
    first features marked with a first marking that designates said first features to be included on a first photomask;
    second features marked with a second marking that designates said second features to be included on a second photomask;

stitching locations marked with stitching markings designating each said stitching location as a location at which said first and second features meet to form a continuous device feature of said design layout; and blocking portions on said design layout not to be decomposed, wherein said marked features of said design layout are marked based upon criteria other than critical dimensions and, said marking features of said design layout comprises marking based upon one of: further features previously formed on said semiconductor device; and previous processing operations performed on said semiconductor device prior to transferring said exposure pattern onto said semiconductor substrate.

6. The method as in claim 5, wherein said design criteria includes design rules for optical proximity correction and overlay.

7. The method as in claim 5, wherein said using a computer for providing instructions to a mask foundry for decomposing said design layout into a plurality of photomasks further comprises said foundry decomposing said design layout into two layout portions, one associated with said first photomask and the other associated with said second photomask, and further comprising manufacturing said first and second photomasks.

8. The method as in claim 5, wherein said using a computer for providing instructions includes one of similarly shaped features marked with a same marking, and similarly sized features marked with a same marking.

9. The method as in claim 5, wherein said marking features of said design layout further comprises marking features that will be subjected to the same processing environment, with the same marking.

10. The method as in claim 5, wherein said marking features of said design layout further comprises marking based upon speed features that substantially determine device speed, each said speed feature marked with said first marking.

11. The method as in claim 5, wherein said identifying comprises said design layout provided by a design tool on a non-transitory computer readable electronic storage medium.

12. The method as in claim 5, wherein at least one of said first marking, said second marking and said stitching markings comprises text features applied to said design layout.

13. The method as in claim 5, wherein at least one of said first marking, said second marking and said stitching markings comprises one of symbols applied to said design layout and block features applied to said design layout.

14. The method as in claim 5, further comprising using said first photomask and a first etching process and said second photomask and a second etching process to transfer said exposure pattern onto a device layer of said semiconductor device.

15. A design layout for a device pattern of a semiconductor device, said design layout comprising:

a non-transitory computer readable electronic storage medium including an electronic file of an exposure pattern for a semiconductor device level, said exposure pattern comprising a design layout, said design layout comprising a plurality of features that combine to form said exposure pattern and markings designating features of said plurality of features to be formed on a particular one of a plurality of photomasks that combine to provide said exposure pattern, said design layout with marked features at a design level and prior to said mask foundry carrying out said decomposing, wherein further similar features previously formed on said semiconductor device are marked with the same marking and different than other features; and all features of said plurality of features that substantially determine device speed are marked with the same marking and different than other features.

16. The design layout as in claim 15, wherein first features of said design layout include first markings designating said first features to be formed on a first photomask, second features with second markings designating said second features to be formed on a second photomask, stitching locations at which said first and second features meet to form a continuous device feature of said design layout including stitching markings, and blocking markings designating portions of said design layout not to be decomposed.

17. The design layout as in claim 15, wherein said markings comprise one of text, symbols and blocks and wherein at least one of similarly sized features include the same marking and similarly shaped features include the same marking.

* * * * *